United States Patent
Lloyd et al.

(10) Patent No.: US 6,878,872 B2
(45) Date of Patent: Apr. 12, 2005

(54) SHIELDING CAGE WITH MULTIPLE MODULE-RECEIVING BAYS

(75) Inventors: Brian Keith Lloyd, Maumelle, AR (US); John Reginald Crane, Little Rock, AR (US)

(73) Assignee: Molex Incorporated, Lisle, IL (US)

(*) Notice: Subject to any disclaimer, the term of this patent is extended or adjusted under 35 U.S.C. 154(b) by 0 days.

(21) Appl. No.: 10/813,479

(22) Filed: Mar. 30, 2004

(65) Prior Publication Data

US 2004/0216909 A1 Nov. 4, 2004

Related U.S. Application Data

(60) Provisional application No. 60/459,093, filed on Mar. 31, 2003.

(51) Int. Cl.[7] .................................................. H05K 9/00
(52) U.S. Cl. ..................... 174/35 R; 361/816; 361/818; 361/726
(58) Field of Search .......................... 174/35 R, 35 MS, 174/356 C; 361/683, 684, 685, 686, 724, 726, 727, 728, 729, 730, 735, 752, 753, 799, 800, 816, 818

(56) References Cited

U.S. PATENT DOCUMENTS 5,394,305 A * 2/1995 Moral et al. ................ 361/796
5,859,767 A * 1/1999 Fontana ...................... 361/818
6,154,361 A * 11/2000 Anderson et al. ........... 361/685
6,469,906 B1 * 10/2002 Baltz et al. .................. 361/760

* cited by examiner

Primary Examiner—Dean A. Reichard
Assistant Examiner—Carmelo Oliva
(74) Attorney, Agent, or Firm—Thomas D. Paulius

(57) ABSTRACT

An electromagnetic interference (EMI) shielding cage for an electronic module is comprised an electrically-conductive bottom, an electrically-conductive rear panel electrically coupled to said bottom, an electrically-conductive, elongated cover electrically coupled to said bottom and first and second side walls that are electrically and mechanically coupled to said bottom, said rear panel and said elongated cover. Numerous ground lugs, electrically coupled to at least one of: said bottom; rear panel; and first and second side walls provide an electrical pathway for EMI signals to a reference potential. An electrically-conductive, compressible gasket encircling the bottom, top and side walls provides an electrical connection to a front panel, providing additional EMI suppression. Gasket engagement tabs in the top and bottom provide electrical connection between the gasket and panels.

12 Claims, 8 Drawing Sheets

FIG. 10
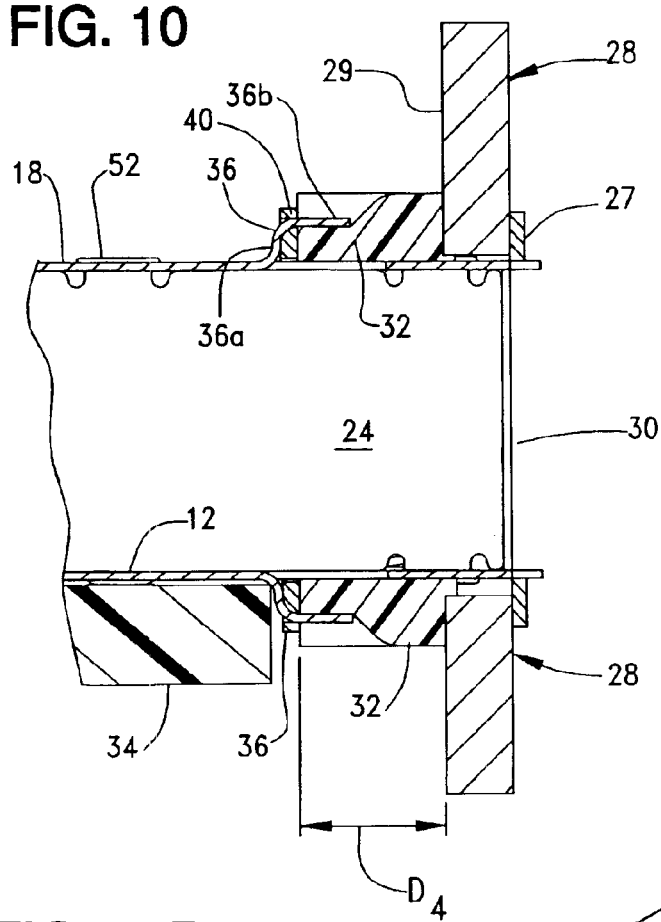
FIG. 11A
FIG. 11B
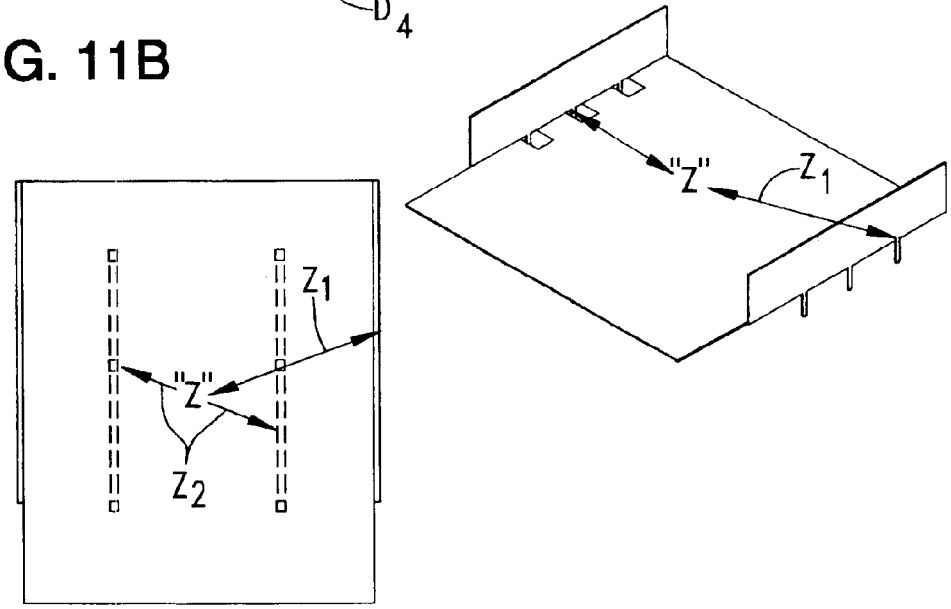

SHIELDING CAGE WITH MULTIPLE MODULE-RECEIVING BAYS

REFERENCE TO RELATED APPLICATIONS

This application claims priority from U.S. Provisional Patent Application No. 60/459,093, filed Mar. 31, 2003.

BACKGROUND OF THE INVENTION

The present invention relates generally to shielding cages used to shield electronic modules from electromagnetic interference, and more particularly to shielding cages that accommodate multiple modules.

In the prior art, electronic circuitry requiring shielding from electromagnetic interference (EMI) is often mounted into a sheet metal chassis, or housing, that suppresses EMI signals. Although prior art EMI-shielded cages provided some EMI suppression, they did not provide a means by which a chassis front panel can be well-grounded. Loose-fitting chassis components provide poor electrical contacts. Depending upon the power level and frequency of EMI, loose-fitting chassis components usually provide poor EMI shielding.

In order to solve this problem, the art has developed metal shielding cages which are attached to circuit boards. In these known cages, a single shielding cage is either constructed from a single sheet of metal or from two sheet metal pieces. In order to provide shielding for electronic components that are used in routers and servers and the like, a single shielding cage must be provided for a single module or device. These modules are spaced apart widthwise on the circuit board and this arrangement takes up a large amount of space. The modules may have a small form-factor pluggable ("SFP") structure and may include optical transceivers, electrical adapters or the like. In the transceiver configuration, the device receives optic data signals, converts them into electrical signal and transmits the electrical signals onto an electrical interface, typically arranged by way of circuits on a circuit board. Cages are provided which are mounted to a device circuit board and which provide a grounded shield against EMI.

It is therefore desirable to provide a metal shielding cage that accommodates multiple modules or electronic adapters which are securely grounded to ground circuits of a circuit board.

SUMMARY OF THE INVENTION

It is therefore a general object of the present invention to provide a shielding cage that accommodates multiple electronic modules or adapters, and in which the cage is connected at a plurality of different points to ground circuits on a circuit board.

Another object of the present invention is to provide a multiple bay shielding cage which is formed from a conductive material and which includes a base plate that includes at least a pair of exterior walls that define sides of the cage, and at least one inner wall that is disposed intermediate the exterior walls and which separates the interior of the cage into at least two module-receiving receptacles, the cage further including a cover member that closes off the top of the base between the exterior sidewalls.

A further object of the present invention is to provide a shielding cage having multiple module-receiving bays, the cage having a base portion with a bottom wall and at least two sidewalls that extend up at its perimeter, a plurality of distinct inner wall members that are joined to the base portion in a spaced-apart fashion to cooperatively define with the sidewalls, a plurality of module-receiving bays, the cage further including a cover portion that closes off the top of the bays, the inner wall members being joined to the base portion and the cover portion to form the configuration of the cage, the inner wall members further including grounding legs depending therefrom for connecting the inner wall members to ground circuits on a circuit board whereby at least one connection is provided to ground between each of the module bays.

Yet another object of the present invention is to provide a shielding cage with an improved construction, the shielding cage having multiple bays for receiving multiple electronic modules therein, the cage including a base formed from a conductive material and a cover formed of a conductive material, the base and cover, when engaged, forming a receptacle therebetween, the base further including members that extend into electrical contact with the cover so as to establish a conductive path between the base and cover, and a plurality of interior wall members that engage both the base and the cover to subdivide the receptacle into multiple receptacles, the interior walls having engagement members that engage the cover of the cage and having engagement members and grounding pins for connecting to a supporting circuit board, the grounding pins of the interior wall members shortening any path to ground along the base of the cage.

The present invention accomplishes these objects by way of its structure which includes a flat base plate with grounding pins integrally formed therewith for attaching the plate to a circuit board. The grounding pins may be straight pins or compliant mounting pins and are preferably formed along two opposing side edges of the base. A conductive cover member engages the base so as to form an electrically conductive path between the two members. A plurality of interior wall members are provided and have their own integral grounding pins that extend in a line along the bottom edges thereof. These grounding pins are received in holes in the base and they make contact with grounding circuits on the circuit board to which the cage is mounted. The grounding pins of the inner walls serve to reduce in distance any grounding path of the base.

These and other objects, features and advantages of the present invention will be clearly understood through a consideration of the following detailed description.

BRIEF DESCRIPTION OF THE DRAWINGS

In the course of this detailed description, the reference will be frequently made to the attached drawings in which:

FIG. 10 is similar to FIG. 9, but taken through the panel and along lines 10—10 of FIG. 1; and, FIGS. 11A and 11B are diagrammatic views illustrating the relationship between the length of ground paths in the cages of the invention.

DETAILED DESCRIPTION OF THE PREFERRED EMBODIMENTS

Figure 1:
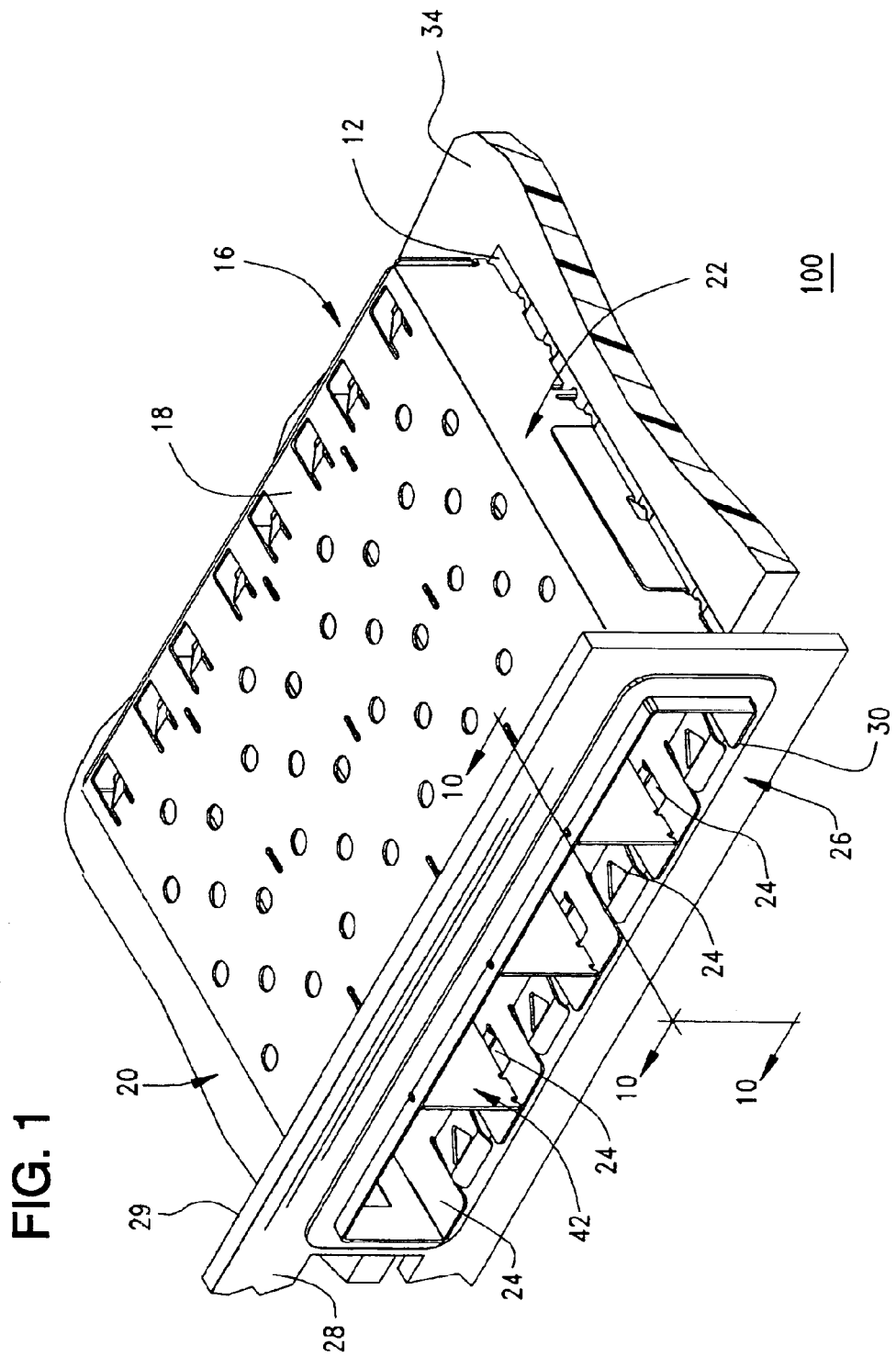
FIG. 1 is a perspective view, partially in section, of a cage assembly constructed in accordance with the principles of the present invention and shown in place upon a circuit board and within a panel opening of an electronic device.

FIG. 1 shows a perspective view of an electromagnetic interference (EMI) shielding cage 100 for housing one or more electronic modules. Electronic modules are typically used to provide a connection between circuits on a circuit board 34 and another electronic device. These are used commonly in data transmission servers and routers. Such modules may include adapters that use a small circuit board to mate with a card edge connector mounted to the circuit board and held within the rear of the cage 100, or may include optical transceivers which permit the conversion of optical signals transmitted through fiber optic cables to electrical signals that are transmitted through circuits on the circuit board 34. The modules or adapters, are plugged into individual bays or receptacles mounted to the circuit board 34 and which have an opening that communicates with the exterior of the device, preferably through a panel 28 of the device. These metal cages 100 are used to shield the modules from external electromagnetic waves, as well as to contain electromagnetic waves emanating from the modules.

The shielding cage 100 shown is substantially rectangular and it will be understood that other configurations may be utilized. The shielding cage 100 is constructed from electrically conductive panels, typically formed from sheet metal and the panels include: a bottom panel 12, a rear panel 16, a cover or top panel 18 and side panels 20 and 22, all of which are considered as "exterior" panels, or walls, of the cage 100. In a preferred embodiment, these exterior panels 12, 16, 18, 20 and 22 can be economically fabricated from both perforated or un-perforated sheet metal. Perforated sheet metal will provide more air movement through the cage 100 but at the possible expense of reduced EMI shielding. In an alternate embodiment, the electrically-conductive bottom 12 can be provided by a conductive layer, of copper for instance, on the top surface of a circuit board 34 to which the shielding cage 100 would be attached.

In the preferred embodiment illustrated, some of the exterior panels, namely, bottom panel 12 can define a base portion of the cage, while the top or cover panel 18, sidewalls 20 and 22 and rear wall 16 cooperatively define the cover portion of the cage. Although a two-part cage is shown for purposes of illustration, it will be understood that the exterior panels may all be formed together from a single piece of sheet metal. Those of ordinary-skill in the art of sheet metal fabrication will recognize that the various exterior panels can be readily formed by bending a single, appropriately-sized sheet metal panel. In various equivalent alternate embodiments, the various exterior panels 12, 16, 18, 20 and 22 can also be formed from one or more individually-stamped panels that are assembled into the cage 100.

As can be seen in FIG. 1, the panels 12, 16, 18, 20 and 22 that make up the cage 100, enclose a volume identified in FIG. 1 as an interior electronic module space 24, which is accessible through an opening 26 of the cage through which an electronic module can pass in the course of installing the module into a connector (not shown) that is enclosed within the shielding cage 100. The connector is typically mounted to the circuit board in the area 125, and mates with the circuit board in a manner to provide a connection to signal traces 126 thereon. The depth D1 of the bottom panel 12 is preferably less than the depth D2 of the top panel 16 so that the bottom panel will not interfere with either the connector itself or the circuit board traces 126 associated with the connector.

The electrically-conductive bottom 12, the rear panel 16, the cover 18 with its sidewalls 20 and 22 are electrically and mechanically coupled together so as to enclose within the electronic module space 24, one or more electronic devices, thereby shielding them from electronic magnetic interference signals from outside the cage 100, but also enclosing within the electronic module space 24, EMI signals that can originate from electronic modules within the space 24 and which would be transmitted away therefrom toward other of the modules. Accordingly, it is important that the bottom 12, the rear panel 16, the cover 18 with its sidewalls 20 and 22 all be electrically coupled together and connected to ground potential via conductive ground paths that existing on or within the circuit board 34 on which the cage 100 is supported.

As can be seen in FIG. 1, the cage 100 is associated and aligned with a front panel 28 of the device, which has an opening 30 formed therein through which an electronic module can be passed into the inner space, or bay 24 of the cage 100. The front panel 28 is typically conductive and it may also provide additional EMI suppression, but can also provide a substrate to which labeling can be applied. As shown in FIG. 1, the front panel 28 is sized and shaped such that the opening 30 encases or encircles a portion of the bottom 12, cover 18, and first and second sidewalls 20 and 22. Inasmuch as the front panel is placed around the top panel 18 in the embodiment illustrated, the side panels 20 and 22 and the bottom panel 12, the dimensions of the opening 30 of the front panel 28 do not normally allow for a tight mechanical bond and a tight electrical connection between the front panel 28 and the exterior panels of the cage 100.

An improved electrical connection between the front panel 28 and the exterior panels is provided by an electrically-conductive compressible gasket that is located behind the cover 28 and not readily shown in FIG. 1. The compressible gasket 32 is formed of electrically conductive material. In the preferred embodiment, the compressible gasket 32 is made up of small-diameter woven wire of sufficient stiffness such that it is readily pliable and will conform to the exterior panels, regardless of shape irregularities and imperfections in their surfaces. In other embodiments, the gasket may be formed from a compressible and pliant plastic, such as a foam rubber, which is selectively of an entirely metallized layer(s) by metal plating the exterior surfaces thereof or the like. The compressible gasket 32 touches both the rear surface 29 of the device front panel 28 and exterior perimeter of the shielding cage 100, by way of its bottom 12, sides 20 and 22 and top panels 18 thereof, to thereby provide a substantially continuous electrical connection between them. The conductive and compressible gasket 32 helps to provide EMI shielding by grounding the front panel 28 to the various panels of the cage 100, which itself is grounded to ground circuits of the circuit board.

Figure 2:
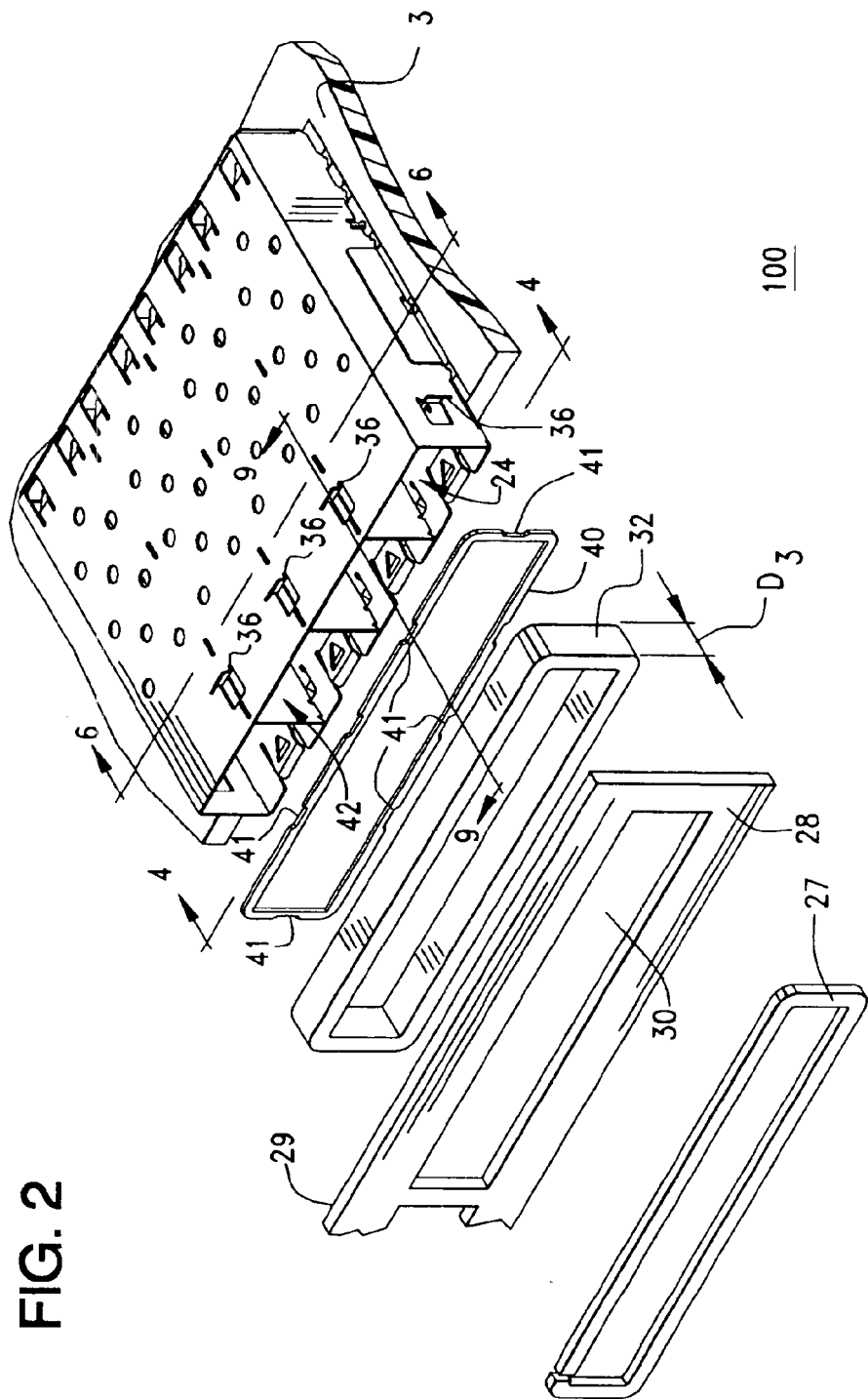
FIG. 2 is an exploded view of the panel, a front EMI control gasket assembly and panels of the EMI shielding cage.

FIG. 2 is an exploded view of the components of the EMI shielding cage 100. As shown more clearly in FIG. 2, the conductive gasket 32 is located directly behind the front panel 30 but in front of a substantially rigid and conductive gasket backing member 40. Inasmuch as the gasket 40 is compressible, the gasket backing member 40 is preferably planar and is sized and shaped so as to assist in compressing the gasket 32 between the device front panel rear surface 29 and the cage 100 at its exterior the top panel 18, the sidewalls 20 and 22 and the bottom 12. In this regard, the gasket has an uncompressed depth D3 that is preferably greater than the depth between the front panel rear surface 29 and the engagement tabs 36 of the cage 100.

As can be seen in FIG. 2, the gasket backing member, or support plate, 40 has several chamfers 41, which are formed into the gasket backing member 40 to accommodate several, "L"-shaped, gasket engagement tabs 36 which are formed as part of the cage components, preferably by stamping and forming them from the top and bottom portions of the cage 100. The L-shaped engagement tab 36 includes a back portion 36a and a clamp portion 36b. The clamp portion 36b engages the backing member 40, preferably at its chamfer 41 to hold the backing member 40 in place on the cage 100, while the back portion 36a presents a stop surface that maintains the backing member 40 in a preselected position and which prevents the backing member from moving further rearwardly on the cage exterior. In this regard, it is preferred that a distance D4 between the engagement tab back portion 36a and the front panel rear surface 29 (FIG. 10) be chosen so that it is less than the depth D3 of the gasket 40, so that the gasket 40 is compressed when the cage and panel are assembled together. As shown in the drawings, a cap 27 may be utilized to hold the front end of the cage 100 in place in the front panel opening 30.

Furthermore, when the gasket backing member 40 is pressed against the gasket 32, the several gasket engagement tabs 36 that protrude from the various top and bottom panels of the cage 100 reach over the backing member 40 and into (or above) the gasket 32 (FIG. 9) so that the engagement tabs 36 mechanically and electrically contact the conductive gasket 32. The mechanical and electrical contact between the engagement tabs 36 and the gasket 32 will thus provide electrical continuity between the front panel 30 and the exterior panels 12, 16, 18, 20 and 22. The difference in the depths D3 and D4 allow for the gasket to compress when the cage assembly is pressed against the front panel 28 to ensure a reliable conductive contact around the perimeter of the cage 100 at the front panel opening 30.

Figure 3:
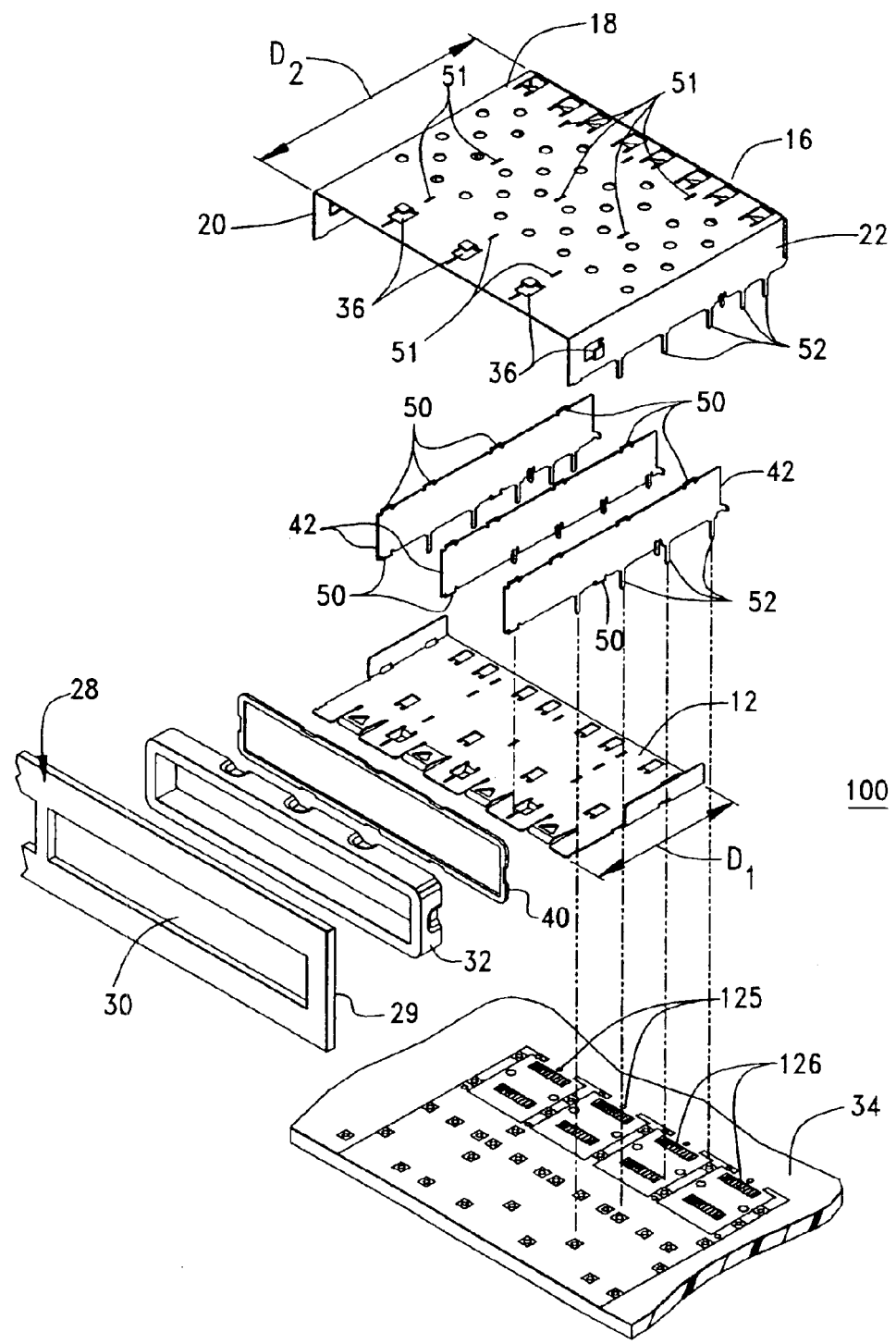
FIG. 3 is an exploded view of the entire assembly of FIG. 1.

FIG. 3 shows an exploded view of the EMI shielding cage 100, including interior walls 42, which by their placement and shape, provide a number of benefits that include: enhanced rigidity to the top and bottom panels; improved electrical and mechanical connections between the top and bottom panels with the gasket; and reduced conductive path lengths to ground through the multiple ground lugs that they provide to a ground or reference potential of the circuit board 34. Although three interior walls 42 are shown in FIG. 3, alternate embodiments of the cage 100 may include any number of interior walls that are constructed and located as described hereinafter.

In FIG. 3, the three interior sidewalls 42 of the cage 100, are oriented substantially perpendicular to both the top panel 18 and the bottom panel 12 so as to define in the interior of the cage 100, first and second module spaces, or bays, wherein the electronic modules can be installed and protected from EMI absorption (and their EMI transmission reduced). The walls 42 are preferably maintained in orthogonal (top and bottom) orientation by a plurality of interior wall engagement tabs 50 that are formed with and disposed on the top and bottom of each wall 42. The interior walls 42 are also further preferably maintained in their orientation by several, longer grounding lugs 52, which are of a length sufficient to extend through holes in the bottom panel 12 into a circuit board on which the cage 100 is preferably mounted and to which it would be grounded. The grounding lugs 52 are illustrated as "eye of needle" style compliant pins.

The interior wall engagement tabs 50 of the interior sidewalls 42 are sized and shaped to protrude through mating, i.e., complementary, slots 51 disposed in the top cover 18 and the bottom panel 12. While such tabs 50 are provided on the interior walls 42 for their fixation and electrical coupling to the top and bottom panels, the exterior sidewalls 20 and 22 can also be provided with engagement tabs 50 by which the sidewalls 20 and 22 can be joined to the top and/or bottom panels, provided of course that the top and bottom panels 18 and 12 are of sufficient length and provided with the requisite complementary slots 51 into which the tabs 51 would be inserted.

In being "complementary", the slots 51 are of a width and length such that the interior wall engagement tabs 50 preferably fit through the slots without an excessive play. When the engagement tabs 50 protrude through the slots 51 in these panels, they may be peened, swaged, knurled, soldered, brazed, welded or glued in place, thereby mechanically and electrically bonding the interior walls 42 to the cover 18 as well as the bottom 12. Those of ordinary skill in the art will recognize that the interior wall engagement tabs 50 could be peened, swaged, knurled at only the top or bottom. In addition to being peened, swaged or knurled, the interior wall engagement tabs 50 can also be soldered, brazed, welded or glued using an electrically conductive adhesive, all of which are considered to be equivalent embodiments of peened or knurled engagement tabs. Seven such engagement tabs 50 are shown in the drawings and they are spaced apart from each other lengthwise of the cage, and some or all of them may be aligned with each other along the top and bottom edges of the interior sidewalls 42.

The interior walls 42 further preferably include several grounding lugs 52 at the bottom of each wall 42. Similarly, each sidewall 20 and 22 has at its bottom, several grounding lugs 52 that provide pathways for electric current to flow from the metallic components of the cage 100 to a ground or reference potential, typically on or in a circuit board to which the cage 100 would be attached. By using several ground lugs 52 that are closely and regularly spaced across the bottom area of the card cage 100, and by electrically joining the grounding lugs 52 to a reference potential on the circuit board 34, EMI to electronic modules in the interior space 24 is more quickly routed to ground or a reference potential, thereby providing improved EMI suppression.

Figure 4:
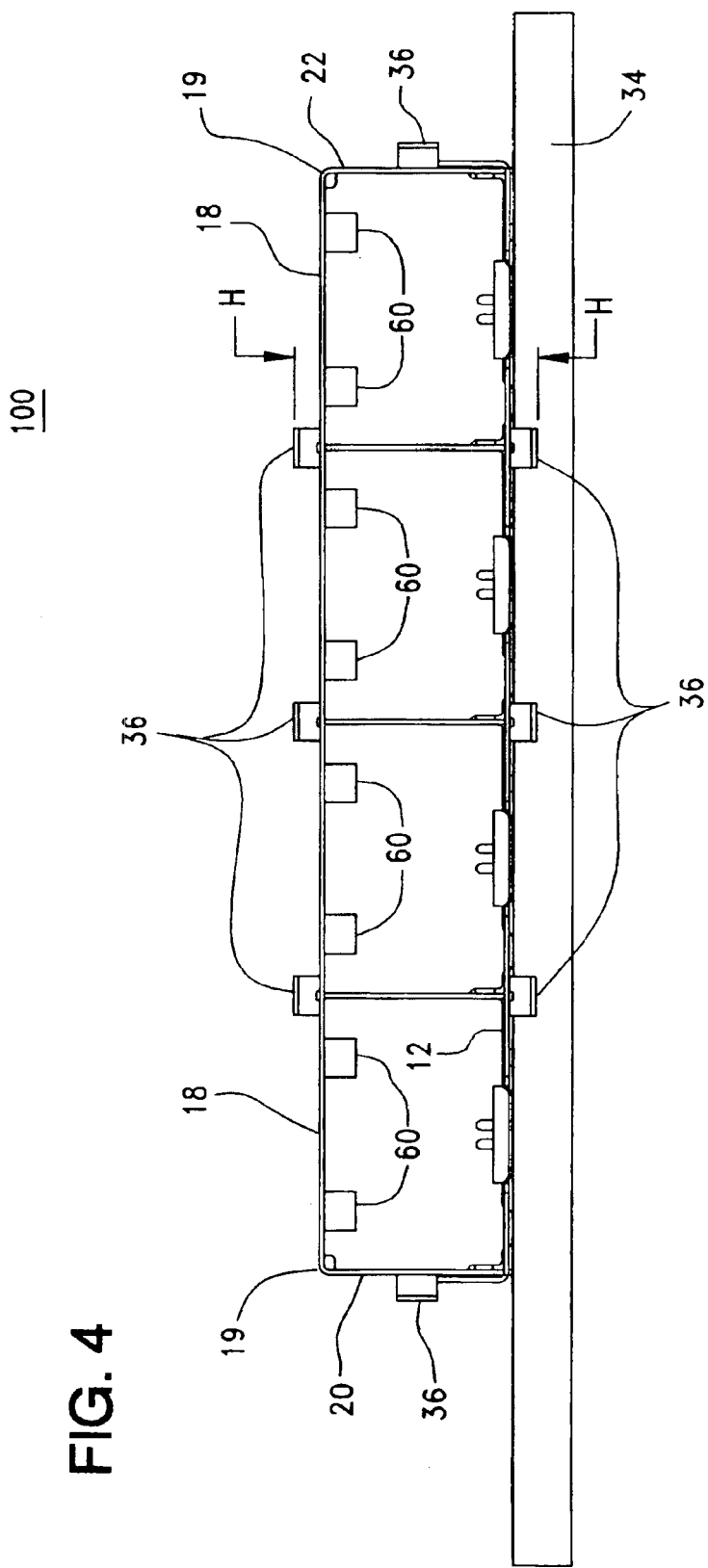
FIG. 4 is a front elevational view of the cage assembly, taken along lines 4—4 of FIG. 2.

FIG. 4 shows a view of the EMI suppression cage 100, albeit from the section lines 4—4 shown in FIG. 2. The EMI shielding cage 100 is mechanically and electrically mounted to conductive pathways, i.e., "traces" on a circuit board 34, by means of the aforementioned grounding lugs 52, but which are not shown in FIG. 4.

In FIG. 4, the radii shown at the corners 19 joining the top 18 and side walls 20 and 22 are attributable to the single sheet of metal from which the top cover 18 is formed, being bent to form the side walls 20 and 22. The gasket engagement clamp portions 36b are shown as projecting above the top of the cover 18 by a predetermined distance H. Similarly the gasket engagement tab clamp portions 36b for the bottom engagement tabs 36 project below the bottom panel 12 by the same distance H. The height H at which the gasket engagement tab clamp portions project above the top of cover 18 and below the bottom panel 12 enables the gasket engagement tabs 36 to compress and/or extend into the electrically-conductive and compressible gasket 32 thereby providing an electrical pathway between the gasket 32 and the electrically conductive exterior panels and interior walls of the cage.

Figure 5:
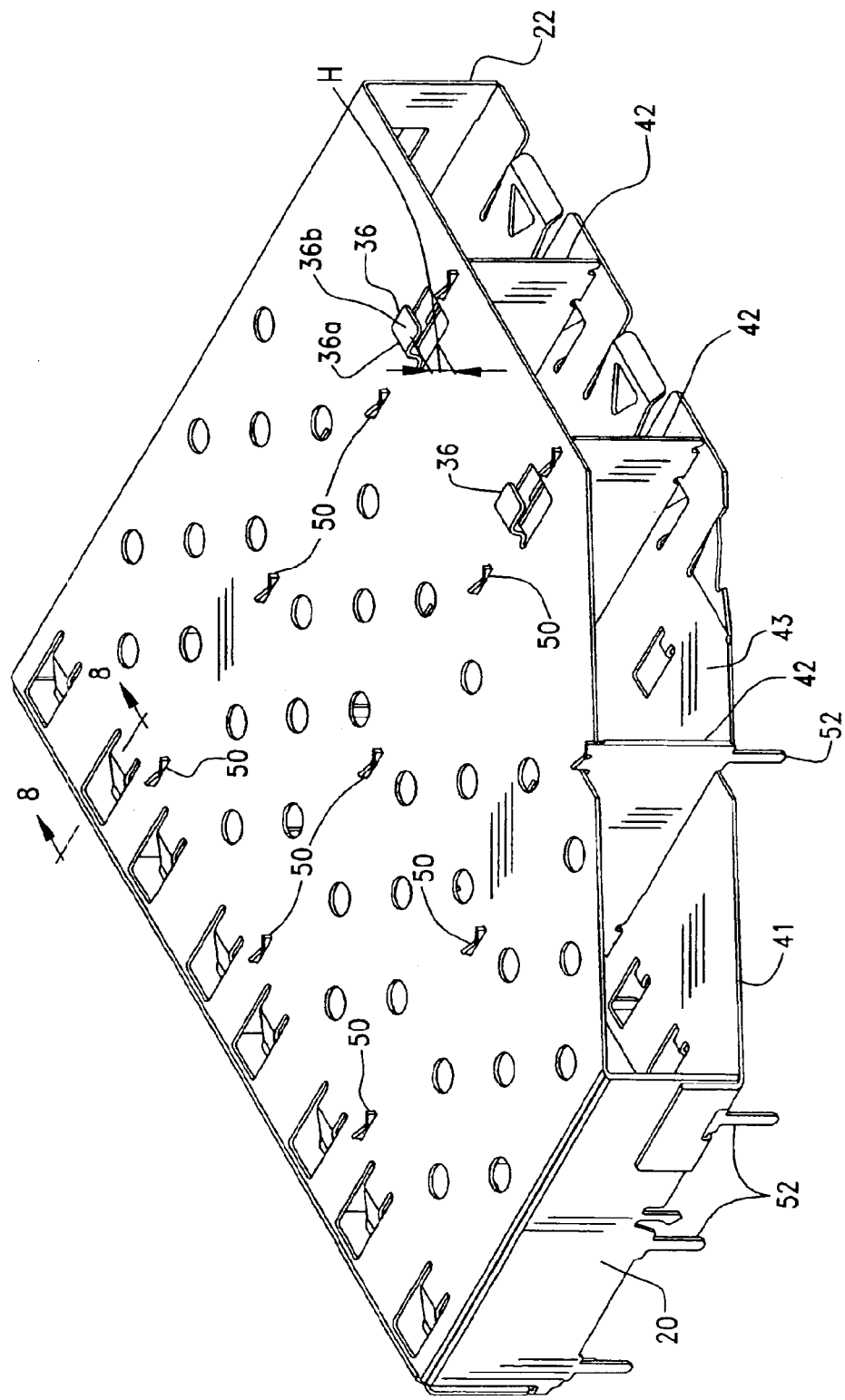
FIG. 5 is a perspective view, partly in section, of the shielding cage of FIG. 1, with a portion broken away for clarity to illustrate the manner in which an interior wall extends through the cover and bottom (base) of the cage.

FIG. 5 shows another perspective view of an assemble EMI shielding cage 100 without the front panel 30 and with the left-front corner cut away in order to more clearly show the interior wall 42, the grounding lugs 52 and the use of the interior wall engagement tabs 50, which protrude above the top panel 18 and below the bottom panel 12. As can be seen in FIG. 5, each of the interior walls 42 defines first and second hollow, module-receiving receptacles 41, 43, into which an electronic module such as a data communication transceiver can be installed and protected from EMI signals or have its own EMI signals suppressed. In a preferred embodiment and as can be seen in FIG. 5, the gasket engagement tabs 36 are formed by stamping them out of the sheet metal from which the top cover 18 is formed. The several grounding lugs 52 extend from the bottom of the cage 100 so as to enable their connection to a circuit board or other substrate to which the cage 100 would be attached. The lugs shown in FIGS. 3 and 5–6 are shown as solid lugs for soldering purposes, awhile the grounding lugs shown in FIG. 7 are shown as hollow, compliant pins for plated through-hole mounting.

There are several ways that the solder lugs can be attached to conductor on a circuit board and provide a good connection. Like the engagement tabs 50, the solder lugs can be attached to the conductors of a circuit board (or another substrate) a number of ways, some of which include peening, knurling, swaging, soldering or brazing.

Figure 6:
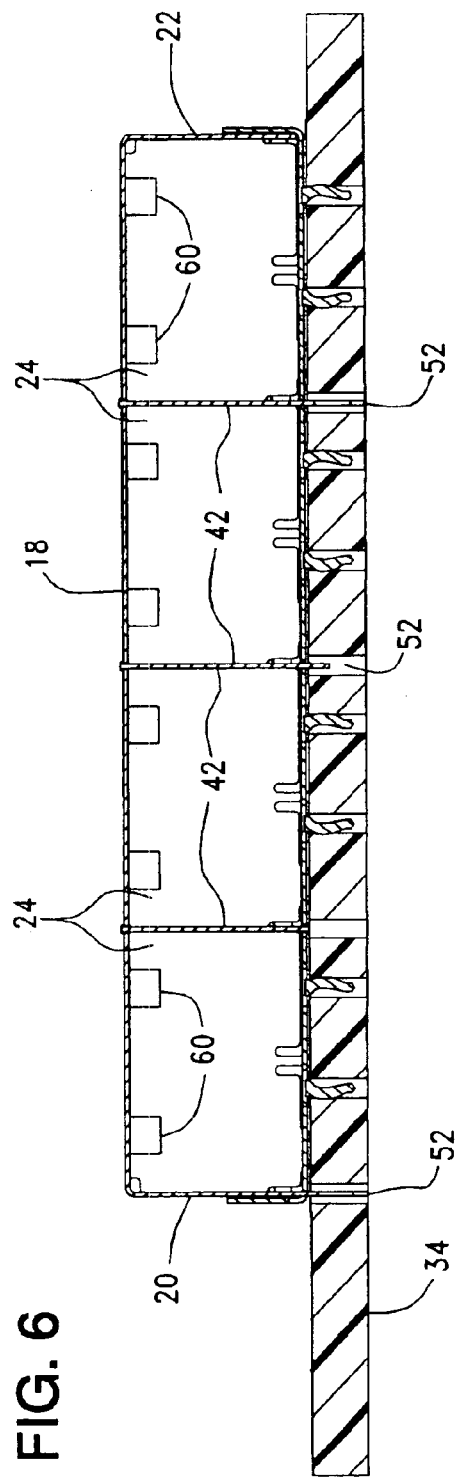
FIG. 6 is a sectional view of the cage of FIG. 1, mounted in place upon a circuit board and taken along section lines 6—6 thereof to illustrate the manner of connection of the cage to the circuit board.

FIG. 6 shows another view of the cage 100 taken along the section lines 66 depicted in FIG. 2 showing the side walls 20 and 22 and the interior walls 42. At the back, or rear, of each electronic module space 24 there are compressive mounting tabs 60, also known as module contacting elements, which are formed by stamping the metallic cover 18 and which provide to an electronic module installed in the electronic module spaces 24, a bias force that can be used to maintain the position of a module inserted within the cage receptacle so as to promote coupling to a connector in the module spaces 24 to which a module would be connected.

Figure 7:
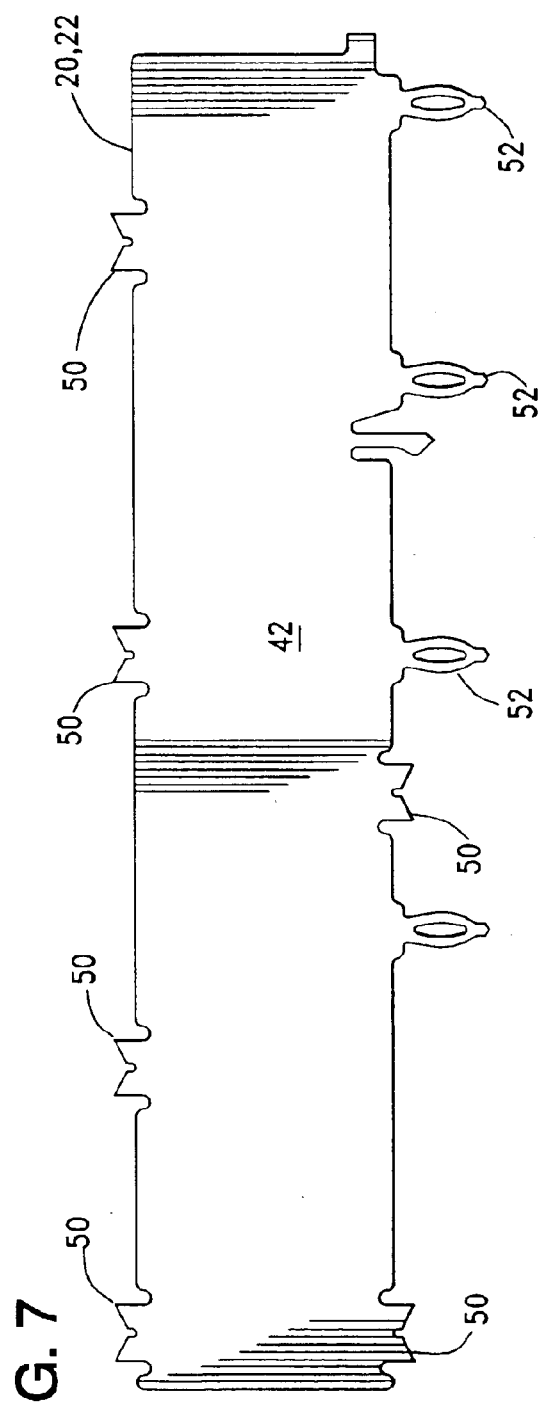
FIG. 7 is a side elevational view of one of the inner walls of the cage assembly of FIG. 1.

FIG. 7 shows a side view of one of the interior walls 42, depicting the interior wall engagement tabs 50 and the compliant grounding lugs 52 by which the interior wall 42 is maintained orthogonal to the top 18 and bottom 12 and by which an improved ground connection is provided. The grounding lugs 52 extend from the lower edge of the wall 42 and provide a structure, i.e., a "means" for electrically coupling the wall 42 to a ground potential on a circuit board (not shown in FIG. 7 but identified by reference numeral 34 in FIG. 6) to which the EMI shielding cage 100 would be electrically and mechanically attached. In a preferred embodiment, at the top edge of the wall 42 and along the bottom, there are wall engagement tabs 50 although alternate embodiments would include using engagement tabs 50 at only the top and relying on the solder lugs 52 along the bottom. The wall engagement tabs are of a sufficient height to extend through slots 51 in the top cover 18 and in the bottom panel 12 such that their height provides material that can be peened, swaged, knurled, soldered, brazed, welded or glued, in order to permit the wall engagement tabs 50 to be electrically connected to the top 18 and bottom panels 12. Those of ordinary skill in the mechanical arts will realize that peening, swaging or knurling the wall engagement tabs 50 provides a mechanical connection as well as an electrical connection between the wall 42 and the top cover 18 and bottom panel 12.

Importantly, the grounding lugs 52 on the interior sidewalls 42 provide a reduced path for ground for shielding and shorting problems. If the interior sidewalls 42 were not provided with grounding lugs 52 as shown, the only grounding lugs on the cage 100 would be those formed from the two exterior sidewalls 20, 22. In the occurrence of a short in a module in the center bay shown in FIG. 11A at "Z", the ground path would run from the short location to the exterior sidewalls, a distance shown in that Figure as Z1, which is at least approximately equal to one-half of the width of the cage bottom panel 12. With the addition of the grounding lugs to the interior sidewalls 42, that distance is reduced considerably. As shown in FIG. 11B, with the occurrence of a short at Z, the ground path to a nearby grounding lug of an interior wall is shown at Z2, and is much less than the distance Z1.

Figure 8:
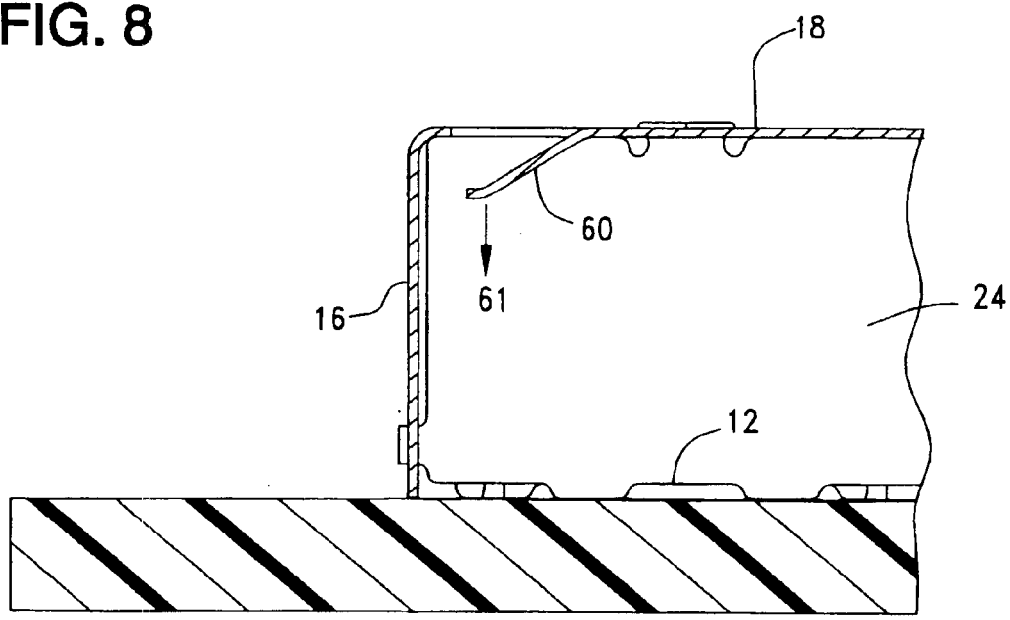
FIG. 8 is a partial sectional view of the rear end wall of the cage assembly of FIG. 5, taken along lines 8—8 thereof and illustrating the module-contacting element formed at the rear of the cage cover.

FIG. 8 shows the back or rear portion of the electronic module space 24 and a compressive tab 60 that is preferably formed by stamping the cover 18. The compressive tab 60 is sized and located so that it provides a downward force 61 against a circuit board or transceiver module installed into the space 24. The downward force 61 acts to maintain electrical contacts between a module and a connector (not shown) in the electronic module space 24.

Figure 9:
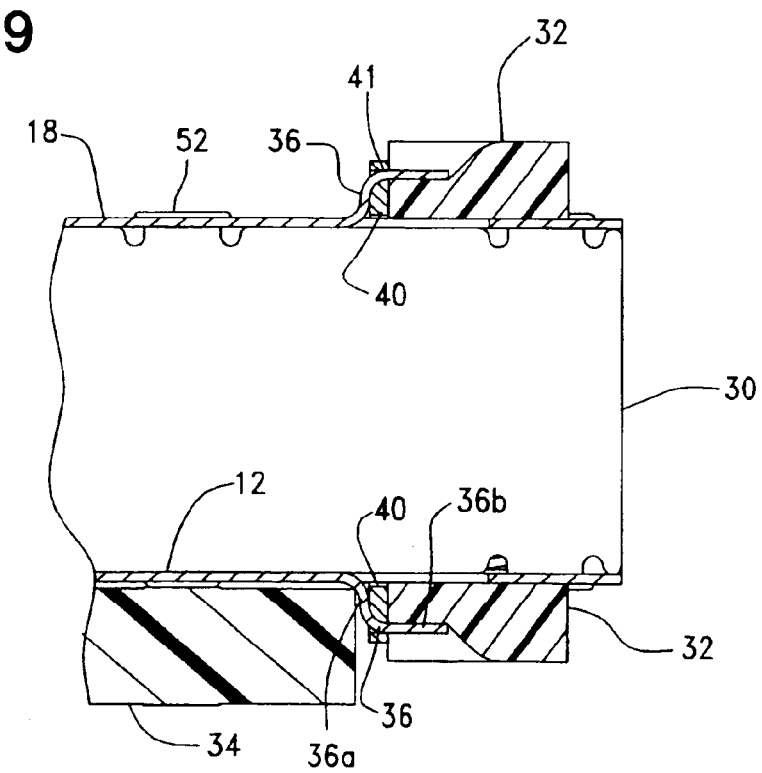
FIG. 9 is a partial sectional view of the front end of the cage assembly of FIG. 2, taken along section lines 9—9 and illustrating the manner in which the EMI control gasket is mounted to and retained in place on the front end of the cage.

FIG. 9 shows a cross sectional view of the electrically-conductive compressible gasket 32 in electrical and mechanical contact with the exterior panels of the EMI shielding cage 100. The aforementioned planar gasket backing member 40 can be seen located between the gasket engagement tabs 36 and the compressible gasket 32. Physical contact between the gasket engagement tab 36 and the gasket 32 provides an improved electrical contact between the gasket and the cover 18, the bottom 12 and the sides (not shown in FIG. 9).

FIG. 10 shows the front cover 28 attached to the EMI shielding cage 100 and the front opening 30 through which an electronic module would be installed into the electronic module space 24. Close electrical contact can be provided between the front panel 28 and the metallic electrically-conductive panels by way of the electrically-conductive and compressible gasket 32 engaging the gasket engagement tab 36.

An important feature of the EMI shielding cage structure is the placement of the interior walls 42 with respect to the gasket engagement tabs 36. Because the gasket 32 is compressible, assembling the front panel 28 to the cage 100 and compressing the gasket 32 will cause a force to be exerted against the gasket engagement tab 36. In other words, the compressible gasket 32 will tend to cause the gasket engagement tabs 36 to rotate away from the gasket 32 and deform or bend the top 18 and bottom panels 12. Depending upon the thickness of the top and bottom panels and the stiffness of the gasket 32, the top and bottom panels can be severely bent. Accordingly, the aforementioned sidewalls 42 are positioned or located beneath or above the gasket engagement tabs 36 so as to stiffen or strengthen the top panel 18 and the bottom panel 12 to opposed deformation or bending that would be caused by the compressive gasket 40 when it is pressed or urged against the front panel 38 and the engagement tab 36. Stated alternatively, the interior walls 42 by their location between the engagement tabs 35 provide flexural rigidity through the top pane 18 and the bottom panel 12 stiffening both panels against a force exerted on these panels by the compressive foam 18 when it is compressed between the engagement tabs 36 and the front panel 28. As can be seen in FIGS. 2, 3, 4 and 5, the interior wall (or walls) 42 are located directly below the gasket engagement tabs 36 so as to reinforce the top and bottom panels against the force exerted on the gasket engagement tabs 36 by the compressible electrically-conductive gasket 32.

By electrically joining the wall engagement tabs 52 to the top panel 18 and the bottom panel 12, the interior walls 42 can be maintained in a substantially perpendicular orientation with respect to the top panel 18 and the bottom panel 12 and provide additional flexural rigidity to the top and bottom panels. By the reinforcement of the top 18 and bottom 12 panels by the interior wall 42 beneath the gasket engagement tabs 42, the thickness of the panels and weight of the cage 100 can be significantly reduced below that which would otherwise be required.

In a preferred embodiment, the electrically-conductive compressible gasket 40 is made up of a compressible foam treated or impregnated with electrically-conductive material. In one embodiment, the gasket 40 is a continuous loop of material, however, in an alternate embodiment a linear length of material could be wrapped around the cage 100 such that the gasket electrically contacts preferably the top 18, the sides 20 and 22, the bottom 12, the front panel 28 and the engagement tabs 36. A layer of adhesive can also be applied to the interior surfaces of the gasket to hold the gasket in place. By means of the gasket material being compressible, conductive, and by the several grounding lugs 52, an improved ground and improved EMI shielding is achieved over the prior art.

From the foregoing it should be apparent that improved EMI suppression can be realized by using an electrically-conductive gasket material between an electrically-conductive front panel 28 and a module shield cage comprised of electrically-conductive panels. By appropriate placement of interior walls 24, a bending moment created by the compressible gasket 40 can be resisted further improving the electrical connection between the panels of the cage 40 and its front panel 28. By evenly distributing or locating the grounding lugs 52, the pathway to ground potential in a circuit board can be reduced to a minimum further improving the suppression of EMI.

Placement of an electronic module, such as an electronic data communications transceiver or two way radio within the electronic module volume 24 will suppress EMI from the module as well as isolate the module from external EMI sources.

While the preferred embodiment of the invention have been shown and described, it will be apparent to those skilled in the art that changes and modifications may be made therein without departing from the spirit of the invention, the scope of which is defined by the appended claims.

We claim:

1. An electromagnetic interference (EMI) shielding cage for an electronic module, said shielding cage comprising:
   a bottom member for mounting to a circuit board;
   a conductive cover member electrically coupled to said bottom member;
   first and second conductive exterior sidewalls electrically coupled to the bottom and cover members, the exterior sidewalls each including at least one exterior grounding leg depending downwardly therefrom;
   at least one interior wall electrically coupled to said bottom and cover members, the interior wall including at least one interior grounding leg depending downwardly therefrom through a corresponding opening disposed in said bottom member for connection to a grounding circuit on said circuit board; and,
   said bottom member, exterior sidewalls and interior wall and cover member defining at least two distinct, adjacent internal cavities of said cage for receiving electronic modules therein, each of the internal cavities including a distinct opening communicating with the exterior of said cage and through which an electronic module can pass.

2. The shielding cage of claim 1, wherein said exterior sidewalls and interior wall each includes a plurality of grounding legs that depend downwardly therefrom.

3. The shielding cage of claim 2, wherein said interior and exterior grounding legs include compliant pins.

4. The shielding cage of claim 3, wherein said interior and exterior grounding legs include eye-of-needle compliant pins.

5. The shielding cage of claim 2, wherein said exterior grounding legs are spaced apart from each other lengthwise along said sidewalls.

6. The shielding cage of claim 1, wherein said interior wall includes a plurality of engagement tabs disposed thereon, the engagement tabs being sized and shaped to mechanically and electrically engage at least one of said electrically-conductive bottom and said electrically-conductive elongated cover.

7. The shielding cage of claim 6, wherein said interior wall engagement tabs are mechanically and electrically coupled to said top by at least one of: peening, swaging, knurling, soldering, brazing, welding and gluing.

8. The shielding cage of claim 7, wherein said interior wall engagement tabs are mechanically and electrically coupled to said bottom by at least one of: peening, swaging, knurling, soldering, brazing, welding and gluing.

9. The shielding cage of claim 2, wherein said interior grounding legs are spaced apart from each other lengthwise along said interior wall.

10. The shielding cage of claim 1, wherein said interior wall is oriented substantially perpendicular to said bottom and cover members and adds flexural rigidity to said cover and bottom members.

11. A multiple bay shielding cage for shielding a plurality of electronic modules that are connected to circuits on a circuit board, comprising:
    a conductive flat base plate with first grounding pins integrally formed therewith for attaching the plate to the circuit board;
    a conductive cover member that engages the base plate in a manner such that said base plate and the cover member cooperatively form a conductive, hollow receptacle into which a plurality of electronic modules may be inserted; and,
    a plurality of interior wall members with second grounding pins integrally formed therewith and extending along a lower edge of the interior wall members, the second grounding pins being spaced apart along the interior wall member lower edges and extending through corresponding openings disposed in said base plate, said interior wall members further including a plurality of engagement tabs that are received within openings formed in said base plate and cover member so as interconnect, electrically and mechanically, said interior wall members to said base plate and cover member, said second grounding pins defining paths to ground within a perimeter of said base plate.

12. The shielding cage of claim 11, wherein said first and second grounding pins are chosen from the group consisting essentially of straight pins and compliant mounting pins.

* * * * *